United States Patent [19]

Hirose

[11] Patent Number: 4,701,035
[45] Date of Patent: Oct. 20, 1987

[54] REFLECTION OPTICAL SYSTEM

[75] Inventor: Ryusho Hirose, Kawasaki, Japan

[73] Assignee: Canon Kabushiki Kaisha, Tokyo, Japan

[21] Appl. No.: 764,001

[22] Filed: Aug. 9, 1985

[30] Foreign Application Priority Data

| Aug. 14, 1984 | [JP] | Japan | 59-169639 |
| Aug. 14, 1984 | [JP] | Japan | 59-169640 |
| Aug. 14, 1984 | [JP] | Japan | 59-169641 |
| Aug. 14, 1984 | [JP] | Japan | 59-169642 |
| Nov. 20, 1984 | [JP] | Japan | 59-246533 |

[51] Int. Cl.$^4$ .............................................. G02B 17/06
[52] U.S. Cl. .................................................... 350/505
[58] Field of Search ............... 350/505, 619, 442, 443, 350/444, 504, 620, 622

[56] References Cited

U.S. PATENT DOCUMENTS

| 3,455,623 | 7/1969 | Harris | 350/505 |
| 4,395,095 | 7/1983 | Horton | 350/505 |
| 4,469,414 | 9/1984 | Shafer | 350/505 |

Primary Examiner—Jon W. Henry
Attorney, Agent, or Firm—Fitzpatrick, Cella, Harper & Scinto

[57] ABSTRACT

A reflection optical system includes at least one component mirror system effective to form an image at an enlarged magnification, at least one component mirror system effective to form an image at a reduced magnification, and an optical system for sequentially and repeatedly forming an image of an object at a reduced overall magnification, the optical system containing the enlarging power component mirror system and the reducing power component mirror system. In one form of the invention, the component mirror systems and an additional component system, if any, are arranged tandem to constitute a tandem compound optical system.

7 Claims, 13 Drawing Figures

MERIDIONAL
IMAGE PLANE

SAGITTAL
IMAGE PLANE

MERIDIONAL IMAGE PLANE

SAGITTAL IMAGE PLANE

REFLECTION OPTICAL SYSTEM

FIELD OF THE INVENTION AND RELATED ART

The present invention relates to a reflection optical system, more particularly, to that system which is usable in a projection type exposure device usable in manufacturing integrated circuits such as an IC, LSI or the like.

The proposals have been made for a reflection optical system for use in printing a circuit pattern of an IC, LSI or the like onto a silicon wafer, as in U.S. Pat. Nos. 3,748,015, 4,097,125, 4,293,186. Among those, U.S. Pat. Nos. 3,748,015 and 4,097,125 disclose that concave and convex mirrors are arranged concentrically or eccentrically, that is, with their centers of curvature being coincident or deviated, and that the total imaging magnification is 1, that is, a unit magnification. In a U.S. Pat. No. 4,293,186, a meniscus lens is used in addition to the concave and convex mirrors of the above type so as to improve the optical performance.

In the conventional reflection optical system, the magnification is one-to-one with the result that the optical elements can be arranged symmetrically, and therefore, comatic aberration and distortion can be made zero. For this reason, a relatively high optical performance can be easily accomplished despite a small number of optical elements, i.e., reflecting mirrors. On the other hand, a projection exposure apparatus of a so-called step-and-repeat type wherein a pattern on a mask is optically projected in a reduced scale on a semiconductor wafer may be used in the manufacturing of the integrated circuits. This type apparatus is used since the overall throughput can be increased in consideration of dust existing during the manufacture of the mask and the IC circuit and in consideration of the possible waving of the wafer.

In order to constitute a reflection type optical system for the projection exposure which can provide a reduced magnification, the optical elements are required to be asymmetrically arranged. This results in production of the comatic aberration or distortion unlike the unit magnification reflecting optical system, and it is difficult generally to accomplish high optical performance. It is particularly difficult to optically correct the aberrations of the reflecting optical system having the magnification of $\frac{1}{4}-1/10$.

SUMMARY OF THE INVENTION

Accordingly, it is a principal object of the present invention to provide a reflection optical system which is suitable for use in a projection exposure apparatus with a reduced magnification, and which is properly corrected in aberration with high resolution.

It is another object of the present invention to provide a reflection optical system in which the light rays are not grreatly shaded.

It is a further object of the present invention to provide a reflection optical system wherein the state of the image formed thereby is easily adjusted.

In one aspect of the present invention, there is provided a reflection optical system, comprising: at least one component mirror system effective to form an image at an enlarged magnification; at least one component mirror system effective to form an image at a reduced magnification; and an optical system for sequentially and repeatedly forming an image of an object at a reduced overall magnification, the optical system containing the enlarging power component mirror system and the reducing power component mirror system. In this aspect, various aberrations resulting from the component mirror system having a reduced imaging magnification are compensated by the corresponding aberrations resulting from the enlarged magnification component mirror system.

In another aspect of the present invention, there is provided a reflection optical system, comprising: at least one component mirror system effective to form an image at an enlarged magnification; at least one component mirror system effective to form an image at a reduced magnification; at least one relaying optical system for preventing loss of light transmission; and a tandem compound optical system for sequentially and repeatedly forming an image of an object at a reduced overall magnification, the optical system containing the enlarging power component mirror system, the reducing power component mirror system and the relaying optical system. In this aspect, the structure of the relay optical system is different from that of the component mirror system, in that the relay system includes at least one concave mirror or a plurality of concave mirrors.

In a further aspect of the present invention a flat mirror is disposed between adjacent component mirror systems to prevent the light rays from being shaded. Also, by disposing a combination of the flat mirrors and said relay optical system, shading can be prevented.

In a further aspect of the present invention, there is provided an reflection optical system, comprising: at least one component mirror system effective to form an image at an enlarged magnification; at least one component mirror system effective to form an image at a reduced magnification; and a tandem compound optical system for sequentially and repeatedly forming an image of an object at a reduced overall magnification, the optical system containing the enlarging power component mirror system and the reducing power component mirror system, wherein optical axes of adjacent component mirror systems are parallel and offset. In this aspect, the possible physical interference between or among component mirror systems can be prevented, and eclipse can be prevented effectively.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
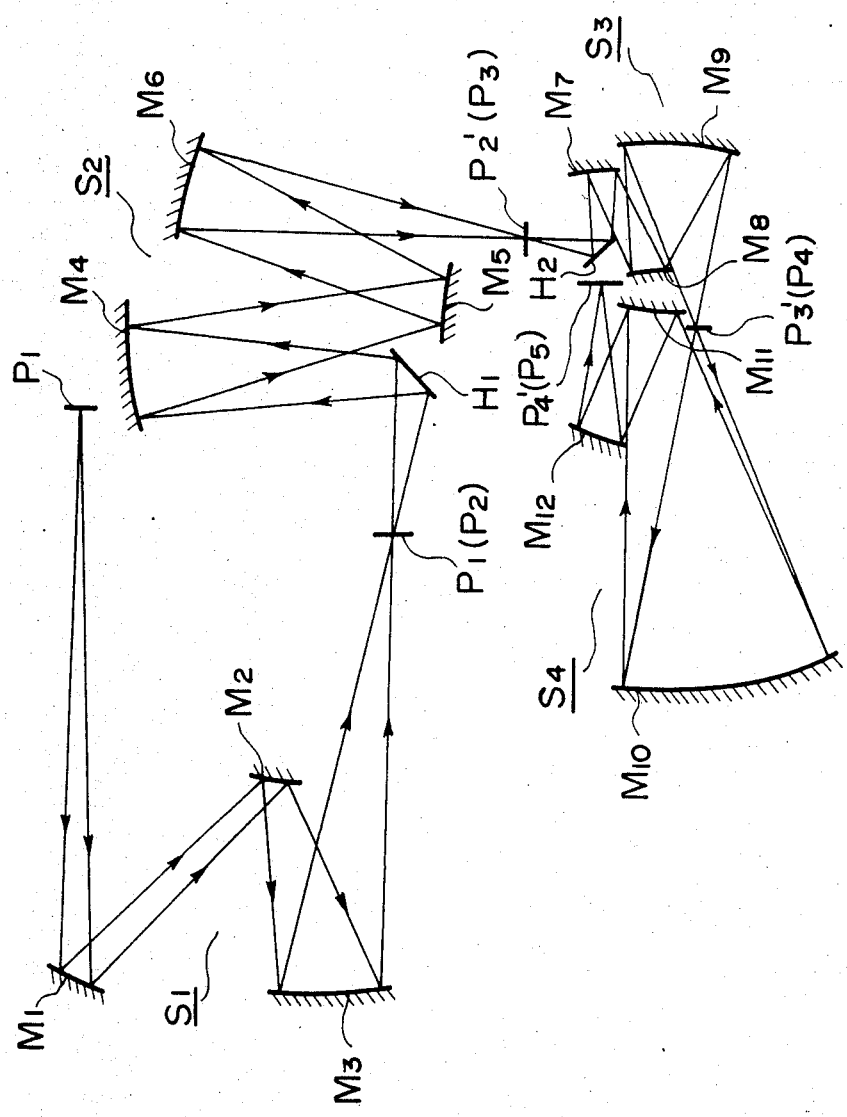
FIG. 1 shows an optical arrangement of the optical system according to a first embodiment of the present invention.
Figure 2:
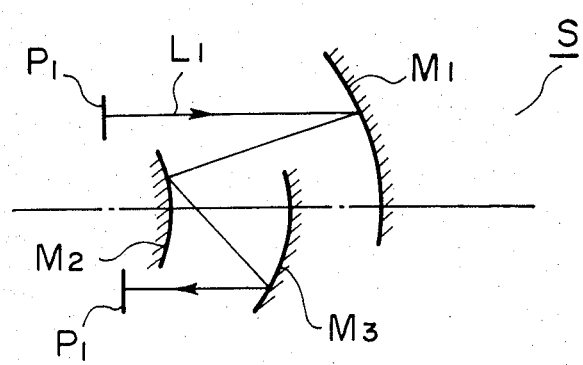
FIGS. 2 and 3 show the arrangement of the optical elements constituting a component mirror system.
Figure 3:
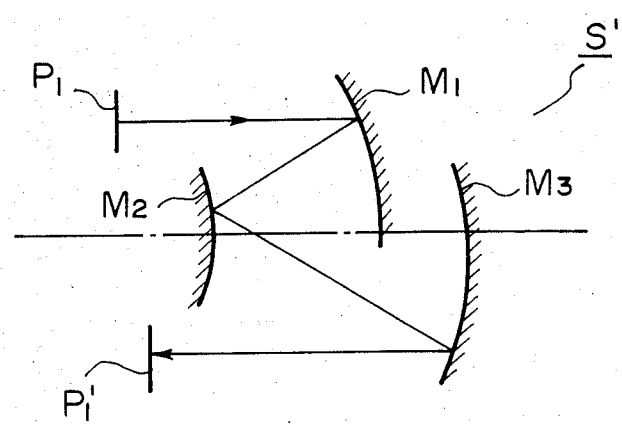

Referring now to FIG. 1, there is shown an optical arrangement of a reflection optical system according to a first embodiment of the present invention, and FIGS. 2 and 3 show the arrangements of component mirror systems S and S' which can be constituent elements of the reflection optical system shown in FIG. 1. For the better understanding of the present invention, the description will be first made with FIGS. 2 and 3, wherein one component mirror system S or S' is constituted by three reflection mirror $M_1$, $M_2$ and $M_3$ having the centers of curvature on the same side, in which two of the reflection mirrors $M_1$ and $M_3$ are concave mirrors having different curvatures, and the other is a convex mirror $M_2$. The centers of curvature of the three reflection mirrors $M_1$, $M_2$ and $M_3$ are all on one and the same axis.

In FIGS. 2 and 3, the three reflection mirrors $M_1$, $M_2$ and $M_3$ are so arranged that the light rays $L_1$ from an object point $P_1$ are reflected by the concave mirror $M_1$ and then by the convex mirror $M_2$, and thereafter, by the concave mirror $M_3$ with the result that the rays are imaged as a point image $P_1'$.

In the component mirror system S shown in FIG. 2, the concave mirror $M_3$ is geometrically substantially between the convex mirror $M_2$ and the concave mirror $M_1$; whereas in the component mirror system S' shown in FIG. 3 the concave mirror $M_1$ is geometrically substantially between the convex mirror $M_2$ and the concave mirror $M_3$. When those component mirror systems S and S' are optically corrected so that the astigmatism is removed in a portion which is off the optical axis indicated by chain lines in FIGS. 2 and 3, the effective area of the object in the optical system shown in FIG. 1 is in the form of an arcuation as shown by "$Q_1$" in FIG. 4.

For this reason, the three reflection mirrors $M_1$, $M_2$ and $M_3$ do not necessarily have a complete circular form or in the symmetric form about the optical axis. Rather, an unnecessary portion may be cut away. For example, as shown in FIG. 3 a bottom portion of the concave mirror $M_1$ is removed, whereby the third concave mirror $M_3$ can be located at the right side of the concave mirror $M_1$. In this embodiment, a plurality of component mirror systems are used, each of which comprises the concave mirror $M_1$, the convex mirror $M_2$ and the concave mirror $M_3$, namely, which comprises the positive power mirror $M_1$, the negative power mirror $M_2$ and the positive power mirror $M_3$, so that various aberrations, particularly, comatic aberration and curvature of field, can be minimized and that the overall imaging performance is improved.

In the reflection optical system shown in FIG. 1, the plural component mirror systems are substantially on one and the same optical axis, and each of the component mirror systems forms an image, and the resultant image provided by the combination thereof is in a reduced scale or magnification.

In the reflection optical system shown in FIG. 1, the reflection mirrors $M_1$, $M_2$ and $M_3$ constitute a first component mirror system $S_1$ having a reduced magnification; reflection mirrors $M_4$, $M_5$ and $M_6$ constitute a second component mirror system $S_2$ having a reduced magnification, too; reflection mirrors $M_7$, $M_8$ and $M_9$ constitute a third component mirror system $S_3$ having a reduced magnification, too; and reflection mirrors $M_{10}$, $M_{11}$ and $M_{12}$ constitute a fourth component mirror system $S_4$ having an enlarged magnification.

By this total system, the object point $P_1$ is imaged repeatedly by the component mirror systems $S_1$, $S_2$, $S_3$ and $S_4$ and finally imaged as a point image $P_5$ at the magnification of 1/5.

Figure 5:
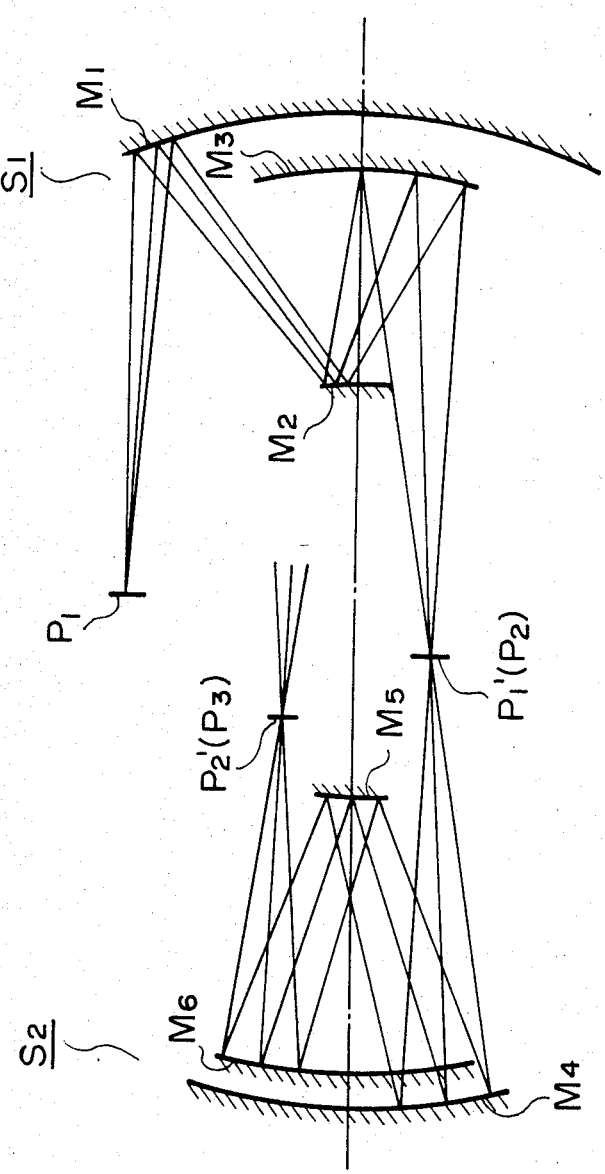
FIG. 5 shows a part of the optical elements in the first embodiment.
Figure 6:
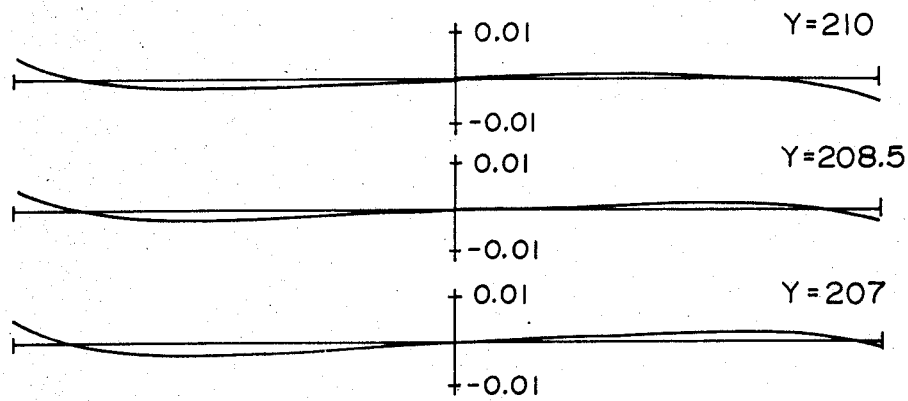
FIG. 6 shows the aberration of the optical system according to the first embodiment.
Figure 6:
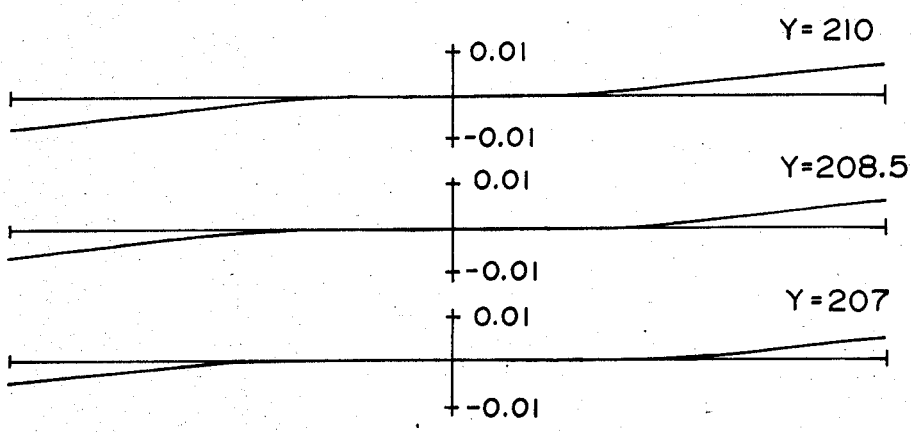

FIG. 5 illustrates the imaging light rays in the component mirror systems $S_1$ and $S_2$ which are parts of the reflection optical system of FIG. 1. The two component mirror systems $S_1$ and $S_2$ are shown in a developed form.

In this Figure, the concave mirror $M_1$, the convex mirror $M_2$ and the concave mirror $M_3$ constitute the first component mirror system $S_1$, while the concave mirror $M_4$, the convex mirror $M_5$ and the concave mirror $M_6$ constitute the second component mirror system $S_2$. The rays $L_1$ from the object point $P_1$ are imaged by the component mirror system $S_1$ as a point image $P_1'$ on the object point $P_2$ of the second component mirror system $S_2$. The rays $L_2$ from the object point $P_2$ are imaged by the second component mirror system $S_2$ as a point image $P_2'$. In the like manner, the imaging action is repeated with the component mirror systems $S_3$ and $S_4$ so as to form a final image of the object at a reduced magnification.

Thus, in this embodiment as shown in FIG. 1, the object point $P_1$ is imaged by the first component mirror system $S_1$ on the image point $P_1'$ which is coincident with the object point $P_2$ of the second component mirror system $S_2$; the object point $P_2$ is imaged by the second component mirror system $S_2$ on the image point $P_2'$ thereof which is coincident with the object point $P_3$ of the third component mirror system $S_3$; and in the similar manner, the imaging is repeated by the component mirror systems $S_3$ and $S_4$ sequentially, so that an image of the object point $P_1$ is formed on the image point $P_4'$ of the last mirror component.

In this embodiment, each of the component mirror systems $S_1$, $S_2$ and $S_3$ forms reduced a image, while the component mirror system $S_4$ forms an enlarged image.

The magnification of each of the component mirror systems in an example of this embodiment is given in Table 1.

TABLE 1

| MIRROR SYSTEMS | OBJECT POINT | IMAGE POINT | MAGNIFICATION |
|---|---|---|---|
| 1 | $P_1$ | $P_1'$ ($P_2$) | 0.4 |
| 2 | $P_2$ | $P_2'$ ($P_3$) | 0.91 |
| 3 | $P_3$ | $P_3'$ ($P_4$) | 0.388 |
| 4 | $P_4$ | $P_4'$ | 1.40 |

In this example of the embodiment, the component mirror systems having the magnifications of Table 1 provides as a whole the magnification of 1/5 with the balanced overall corrections of aberrations.

Particularly because the component mirror system $S_4$ is of an enlarging power, the comatic aberration, the curvature of field and the distortions resulting from the component mirror systems $S_1$, $S_2$ and $S_4$ are corrected by the component mirror system $S_4$.

When a reflection optical system is established by a plurality of reflection optical systems, eclipse can be caused generally. The eclipse is removed in this embodiment by the use of total reflection mirrors $H_1$ and $H_2$ disposed optically between the first component mirror system $S_1$ and the second component mirror system $S_2$, and optically between the second component mirror system $S_2$ and the third component mirror system $S_3$, respectively.

In order to minimize the eclipse under the condition that the overall good optical performance is maintained, it is preferable that the following is satisfied:

$$R_1/R_2 \geq 2 \tag{1}$$

$$R_1/R_3 > 1 \tag{2}$$

where $R_1$, $R_2$ and $R_3$ are radii of curvature of the concave mirror $M_1$, the convex mirror $M_2$ and the concave mirror $M_3$ of component mirror system S, and similarly for each of the four component mirror systems $S_1$, $S_2$, $S_3$ and $S_4$.

Figure 4:
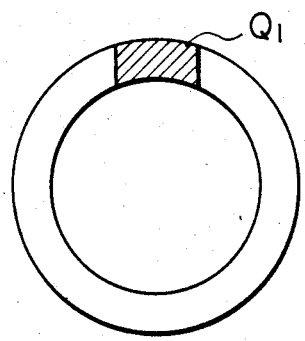
FIG. 4 illustrates an example of an effective object field.

If the inequations (1) and (2) are satisfied when the effective field is a part of the circle as shown in FIG. 4, the image is formed at a predetermined position substantially without off-axis aberration, with the eclipse of the rays from the object and with the size of the total component mirror systems kept small.

If the inequation (1) is not satisfied, the comatic flare is increased and the eclipse is also increased. On the other hand, if the inequation (2) is not satisfied, the radius of curvature of the concave mirror $M_3$ becomes too large as compared with that of the concave mirror $M_1$ with the result that it is difficult to provide the total component mirror systems of a small size under the condition that the predetermined refractive power is maintained.

Furthermore, in order to provide an image of the object at a high contrast with a reduced curvature of field in the apparatus of the first embodiment, the above-described curvatures $R_1$, $R_2$ and $R_3$ satisfy the following:

$$|R_1| > |R_3| > |R_2| \tag{3}$$

It is preferable to satisfy the inequation (3), since otherwise the curvature of field is increased, and the eclipse is also increased, and further it is difficult to satisfactorily correct the aberrations in the reflection optical system having a combined component mirror systems.

By satisfying the above-described inequations for the component mirror systems, a reflection optical system with high resolution is easily obtained. However, it is further preferable that the radius of curvature of each of the component mirror systems $S_2$, $S_3$ and $S_4$ satisfies the following:

$$1.18 < R_4/R_5 < 1.26 \tag{4}$$

$$1.02 < R_6/R_5 < 1.17 \tag{5}$$

$$2.03 < R_7/R_8 < 2.65 \tag{6}$$

$$1.35 < R_9/R_8 < 1.47 \tag{7}$$

$$2.03 < R_{10}/R_{11} < 2.15 \tag{8}$$

$$1.18 < R_{12}/R_{11} < 1.26 \tag{9}$$

where $R_4$–$R_{12}$ are radii of curvature of the reflection mirrors in the component mirror systems $S_2$, $S_3$ and $S_4$.

The inequation (4) is effective to satisfactorily correct the comatic aberration, and the comatic flare increases outside the ranges defined thereby.

The inequations (5) and (7) are effective to increase the contrast in the sagittal image plane. It is preferable that the inequations are satisfied since otherwise the field of curvature increases in the positive or negative direction.

The inequations (6) and (8) are effective to reduce the flare component in the meridional image plane, and the curvature of field increases in the positive or negative direction outside the ranges defined thereby.

The inequation (9) is effective to reduce the astigmatism over the entire effective field of the object which is in the form of an arcuation. It is preferable to satisfy this since otherwise the astigmatism is increased.

In the first embodiment, it is preferable to effect the imaging adjustment by displacing at least one component mirror system of the component mirror systems $S_1$, $S_2$, $S_3$ and $S_4$, in terms of the aberration correction and the magnification adjustment.

The following is an example of data of the optical system constructed in accordance with the first embodiment.

| | |
|---|---|
| $R_1 = -626.9$ | $D_1 = -280$ |
| $R_2 = -134.4$ | $D_2 = 224.875$ |
| $R_3 = -386.5$ | $D_3 = -990$ |
| $R_4 = 576.518$ | $D_4 = 330$ |
| $R_5 = 472.86$ | $D_5 = -292.3$ |
| $R_6 = 516.98$ | $D_6 = 540.15$ |
| $R_7 = -366.935$ | $D_7 = -118.4$ |
| $R_8 = -147.45$ | $D_8 = 141.75$ |
| $R_9 = -208$ | $D_9 = -578.35$ |
| $R_{10} = 435.96$ | $D_{10} = 400$ |
| $R_{11} = 209.22$ | $D_{11} = -148.494$ |
| $R_{12} = 252.51$ | |

In the above data, $R_i$ is a radius of curvature of i-th reflection mirror as counted from the object point $P_1$. And, $D_i$ is the distance between the adjacent reflection mirrors, wherein the data thereof are positive when majored from the left to the right along the travel of the light rays, and negative in the opposite direction.

The effective field is 3 mm in the width of slit, and the effective F number is 2.8 (NA=0.18). The width of the effective field of the object point $P_1$ is in the range from an image height of 207 mm to that of 210 mm.

Figure 7:
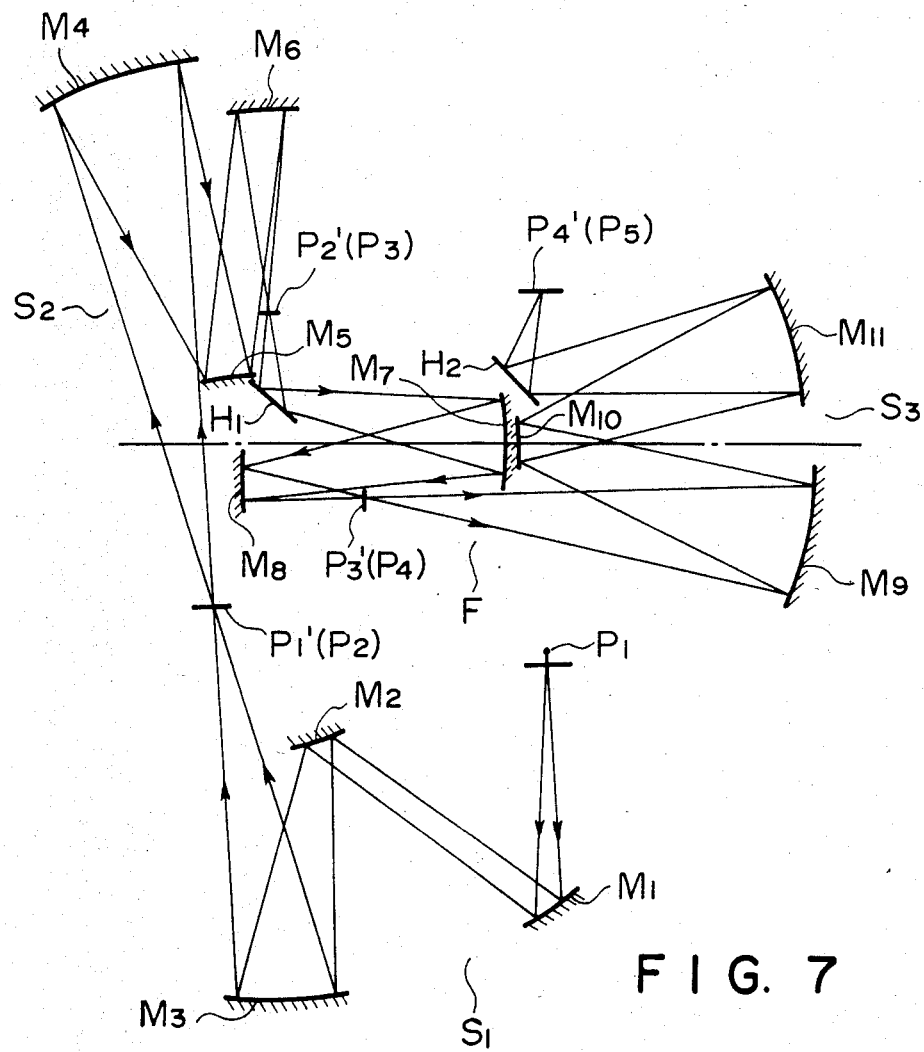
FIG. 7 shows an optical arrangement of the apparatus according to a second embodiment of the present invention.
Figure 8:
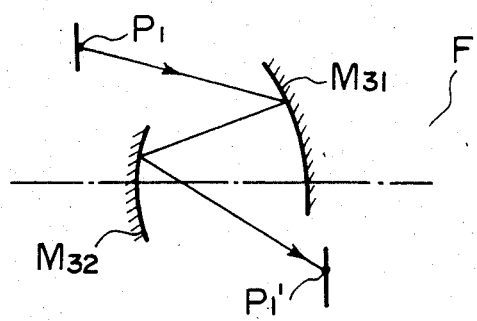
FIG. 8 illustrates the relaying optical system usable with the second embodiment of the present invention.

FIG. 7 shows an optical arrangement of the apparatus according to a second embodiment of the present invention. In this reflection optical system, reflection mirrors $M_1$, $M_2$ and $M_3$ constitute a first component mirror system $S_1$; reflection mirrors $M_4$, $M_5$ and $M_6$ constitute a second component mirror system $S_2$; reflection mirrors $M_7$ and $M_8$ constitute a relaying optical system F; and reflection mirrors $M_9$, $M_{10}$ and $M_{11}$ constitute a third component mirror system $S_3$. By this total optical system, the object point $P_1$ is imaged repeatedly by the component mirror systems $S_1$ and $S_2$, the relaying system F and the component mirror system $S_3$, and finally imaged as a point image $P_5$ ($P_4'$) at the magnification of 1/4.3. The component mirror systems constituting the reflection optical system shown in FIG. 7 each have such a construction as shown in FIG. 2. The relaying optical system F is established by two concave mirrors $M_{31}$ and $M_{32}$ in this embodiment as shown in FIG. 8, and the light from the object point $P_1$ is imaged on the image point $P_1'$. In the second embodiment, the relaying optical system F is disposed optically between the second component mirror system $S_2$ and the third component mirror system $S_3$ to perform the field effect so that the diameter of the light rays to the third component mirror system $S_3$ is reduced, by which the size of the reflection optical system is reduced.

Similarly to the first embodiment, the effective object field is in the form of an arcuation $Q_1$ as shown in FIG. 4. Therefore, the shape of each of the reflection mirrors is not necessarily circular, but an unnecessary portion thereof may be cut away so as to reduce the size of the reflection optical system.

Thus, in this embodiment as shown in FIG. 7, the object point $P_1$ is imaged by the first component mirror system $S_1$ on the image point $P_1'$ which is coincident with the object point $P_2$ of the second component mirror system $S_2$; the object point $P_2$ is imaged by the second component mirror system $S_2$ on the image point $P_2'$ thereof which is coincident with the object point $P_3$ of the relaying mirror system F; and in the similar manner, the imaging is repeated by the relaying mirror system F and the component mirror system $S_3$ sequentially so that an image of the object point $P_1$ is formed on the image point $P_4'$ of the last mirror component at a reduced magnification. In this embodiment, each of the component mirror systems $S_1$ and $S_3$ and the relaying mirror system F, respectively forms a reduced image, while the component mirror system $S_2$ forms an enlarged image. The magnification of each of the component mirror systems in an example of this embodiment is given in Table 2.

TABLE 2

| | OBJECT POINT | IMAGE POINT | MAGNIFICATION |
|---|---|---|---|
| MIRROR SYSTEM $S_1$ | $P_1$ | $P_1'$ ($P_2$) | 0.278 |
| MIRROR SYSTEM $S_2$ | $P_2$ | $P_2'$ ($P_3$) | 1.0092 |
| RELAY SYSTEM F | $P_3$ | $P_3'$ ($P_4$) | 1.0 |
| MIRROR SYSTEM $S_3$ | $P_4$ | $P_4'$ | 0.826 |

In this example of the embodiment, the combination of the three component mirror systems and one relaying mirror system which have the magnifications of Table 2 provides as a whole the magnification of 1/4.3 with the balanced overall corrections of aberrations. Particularly because the component mirror system $S_2$ is of an enlarging power, the comatic aberration, the curvature of field and the distortion resulting from the component mirror system $S_1$ and $S_3$ and the relaying mirror system F are corrected by the component mirror system $S_2$.

When a reflection optical system is established by a plurality of reflection optical systems, the eclipse can be produced. This eclipse is removed in this embodiment by the use of total reflection mirrors $H_1$ and $H_2$ disposed optically between the second component mirror system $S_2$ and the relaying optical system F, and optically behind the third component mirror system $S_3$, respectively.

In order to minimize the eclipse under the condition that overall good optical performance is maintained, it is preferable that the above inequations (1) and (2) are satisfied.

Further, in order to minimize the eclipse with the reduction of the size of the component mirror system, it is preferable that the following is satisfied:

$R_1'/R_2' > 1$, and $$R_1'/R_3' > 1 \qquad (10)$$

where $R_1'$, $R_2'$ and $R_3'$ are radii of curvature of the concave mirror $M_1$, the convex mirror $M_2$ and the concave mirror $M_3$ of the second component mirror system $S_2$. When the inequation (10) is not satisfied, it is difficult to form an image of the image formed by the component mirror system $S_1$ on the object point of the relaying mirror system F without shading the light rays,.

In order that the relaying mirror system F serving as a field effect system effectively converges the rays from the second component mirror $S_2$ to form an image on the object point of the third component mirror system $S_3$, it is preferable that the radii $R_{31}$ and $R_{32}$ of the curvature of the concave mirrors $M_{31}$ and $M_{32}$ in the relaying optical system F satisfy:

$$|R_{31}/R_{32}| < 1 \qquad (11)$$

When this is not satisfied, it is difficult that the relaying mirror system F sufficiently performs the field effect, and therefore, that the size of the third component mirror system $S_3$ is reduced.

In this embodiment, it is preferable that the imaging adjustment is effected by displacing at least one component mirror system of the component mirror systems $S_1$, $S_2$ and $S_3$ and the relaying optical system F in terms of the aberration correction and the magnification adjustment. The following is an example of data of the apparatus according to the second embodiment.

| | |
|---|---|
| $R_1 = -640$ | $D_1 = -280$ |
| $R_2 = -140.5$ | $D_2 = 270$ |
| $R_3 = -385$ | $D_3 = -1010$ |
| $R_4 = 564.26$ | $D_4 = 335$ |
| $R_5 = 439.67$ | $D_5 = -280$ |
| $R_6 = 448.68$ | $D_6 = 580$ |
| $R_7 = -422.38$ | $D_7 = -292.5$ |
| $R_8 = 1011.5$ | $D_8 = 625$ |
| $R_9 = -489$ | $D_9 = -320$ |
| $R_{10} = -167.58$ | $D_{10} = 310$ |
| $R_{11} = -449.79$ | |

The effective object field is 2 mm in the slit width, and the effective F number is 3.3 (NA=0.15). The width of the effective field of the object point $P_1$ exists from the image height of 218 to that of 220 mm.

Figure 9:
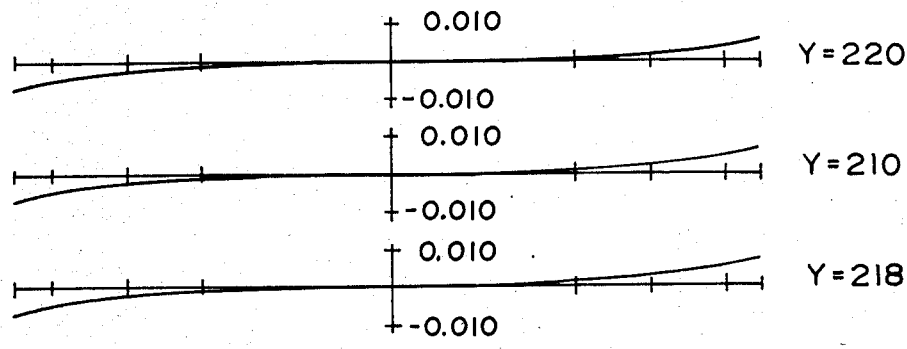
FIG. 9 shows the aberration of the optical system according to the second embodiment.
Figure 9:
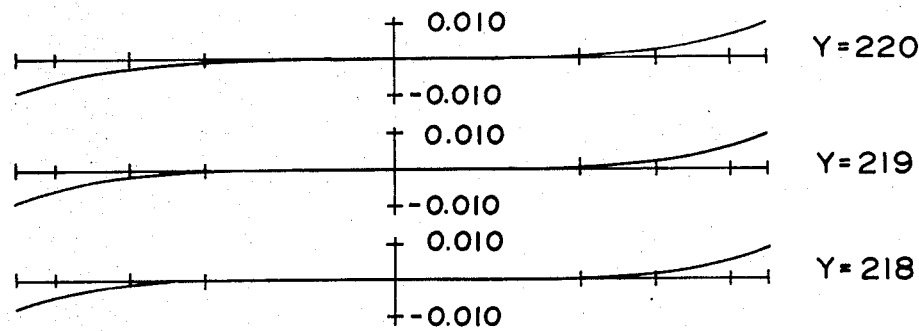

FIG. 9 shows the aberrations of the example of the second embodiment.

Figure 10:
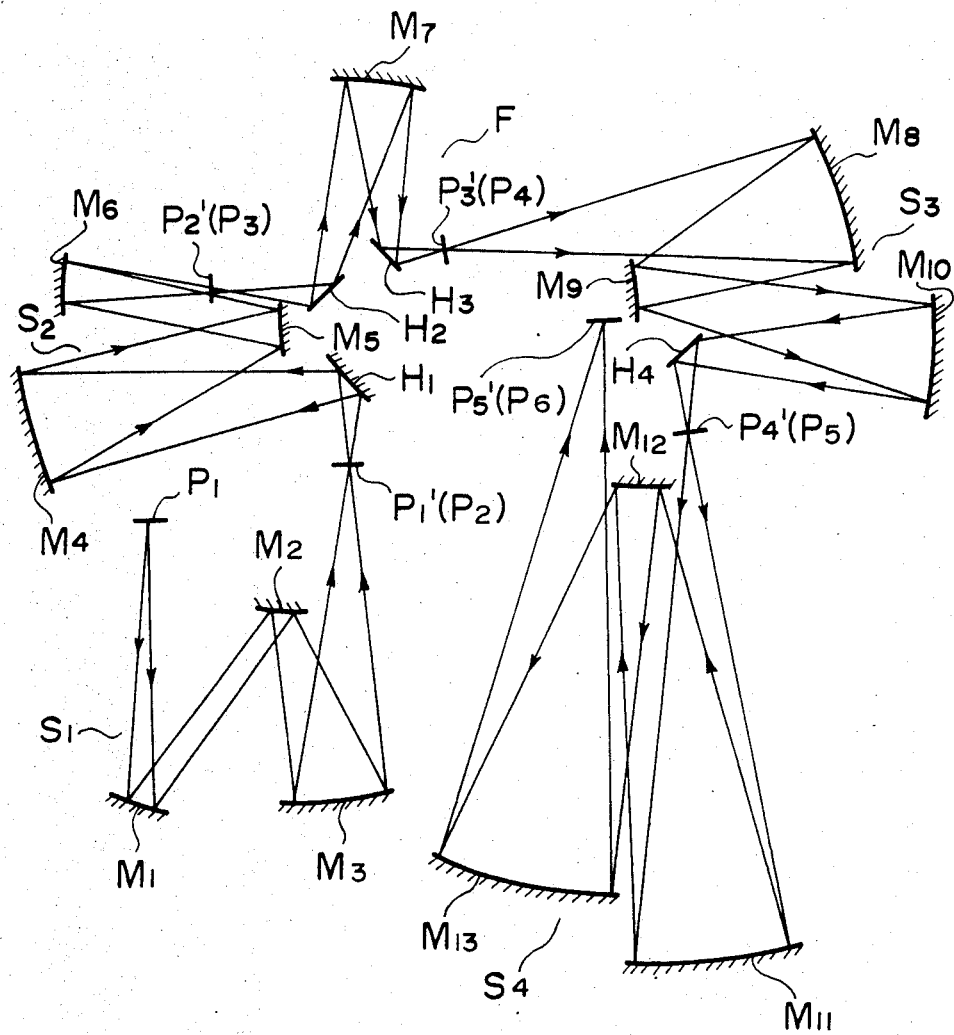
FIG. 10 shows an optical arrangement of the apparatus according to a third embodiment of the present invention.

FIG. 10 shows an optical arrangement of the reflection optical system according to the third embodiment of the present invention. The optical system of this embodiment includes three of such component mirror systems S as shown in FIG. 2, one of such component mirror system S' and a relaying mirror system F including concave mirrors. Those optical elements are positioned substantially on one and the same optical axis so that the overall imaging magnification is less than the unity, that is, reduction. According to this embodiment, a reflection optical system with high resolution is provided. In the reflection optical system in this embodiment, reflection mirrors $M_1$, $M_2$ and $M_3$ constitute a first component mirror system $S_1$; reflection mirrors $M_4$, $M_5$ and $M_6$ constitute a second component mirror system $S_2$; a reflection mirror 7 constitutes a relaying optical system F; reflection mirrors $M_8$, $M_9$ and $M_{10}$ constitute a third component mirror system $S_3$; reflection mirrors $M_{11}$, $M_{12}$ and $M_{13}$ constitute a fourth component mirror system $S_4$.

By the entire optical system, the object point $P_1$ is imaged sequentially and repeatedly by the component mirror systems $S_1$, $S_2$, the relaying mirror systems F and the component mirror systems $S_3$ and $S_4$, and finally imaged as a point image $P_6(P_5')$ at the manification of $\frac{1}{4}$.

Thus, in this embodiment as shown in FIG. 10, the object point $P_1$ is imaged by the first component mirror system $S_1$ on the image point $P_1'$ which is coincident with the object point $P_2$ of the second component mirror system $S_2$; the object point $P_2$ is imaged by the second component mirror system $S_2$ on the image point $P_2'$ thereof which is coincident with the object point $P_3$ of the relaying mirror system F; and in the same manner, the imaging is repeated by the relaying mirror system F, the component mirror system $S_3$ and the component mirror system $S_4$ sequentially so that an image of the object point $P_1$ is formed on the image point $P_5'$ of the last mirror component at a reduced magnification.

In this embodiment, the component mirror systems $S_1$ and $S_4$ and the relaying mirror system F, respectively form reduced images, while the component mirror systems $S_2$ and $S_3$ form enlarged images, respectively.

The magnification of each of the component mirror systems in an example of this embodiment is given in Table 3.

TABLE 3

|  | OBJECT POINT | IMAGE POINT | MAGNIFICATION |
|---|---|---|---|
| MIRROR SYSTEM $S_1$ | $P_1$ | $P_1'$ ($P_2$) | 0.31 |
| MIRROR SYSTEM $S_2$ | $P_2$ | $P_2'$ ($P_3$) | 1.05 |
| RELAY SYSTEM F | $P_3$ | $P_3'$ ($P_4$) | 0.816 |
| MIRROR SYSTEM $S_3$ | $P_4$ | $P_4'$ ($P_5$) | 1.0 |
| MIRROR SYSTEM $S_4$ | $P_5$ | $P_5'$ ($P_6$) | 0.964 |

In this example of the embodiment, the combination of the four component mirror systems and the relaying mirror system which have the magnifications of Table 3 provides as a whole the magnification of 1/4.3 with the balanced overall corrections of aberrations.

Particularly because the component mirror systems $S_2$ and $S_3$ are of enlarging power, the comatic aberration, the curvature of field and the distortion resulting from the component mirror systems $S_1$ and $S_4$ and the relaying mirror systems F are corrected by the component mirror systems $S_2$ and $S_3$.

In the third embodiment, the relaying mirror system F is disposed optically between the second component mirror system $S_2$ and the third component mirror system $S_3$ so as to perform the field effect, by which the diameter of the light rays to the third component mirror system $S_3$ is reduced.

When a reflection optical system is established by a plurality of reflection optical system, the eclipse can be produced. The eclipse is removed in this embodiment by the use of total reflection mirrors $H_1$, $H_2$, $H_3$ and $H_4$ between adjacent component mirror systems.

In order to minimize the eclipse under the condition that the overall good optical performance is maintained with the aberrations of the component mirror systems reduced, it is preferable that the following is satisfied:

$$R_4/R_5 > 1 \tag{12}$$

$$R_4/R_6 > 1 \tag{13}$$

$$R_8/R_9 \geq 2 \tag{14}$$

$$R_{10}/R_9 > 1 \tag{15}$$

where $R_4$, $R_5$ and $R_6$ are radii of curvature of the concave mirror $M_1$, the convex mirror $M_2$ and the concave mirror $M_3$ of the second component mirror system $S_2$; and $R_8$, $R_9$ and $R_{10}$ are radii of curvature of the concave mirror $M_1$, the convex mirror $M_2$ and the concave mirror $M_3$ of the third component mirror system $S_3$.

The inequations (12) and (13) are effective to satisfactorily correct the comatic aberration and the curvature of field, and the comatic aberration is increased together with increase of the inclination of meridional image plane if the inequation (12) is not satisfied; and the inclination of sagittal image plane is increased if the inequation (13) is not satisfied.

The inequations (14) and (15) are effective to reduce the comatic aberration and the flare of the sagittal image plane, and it is preferable that the inequations are satisfied, since dissatisfaction of the inequation (14) results in large comatic aberration making it difficult to provide a high contrast projected image; also since if the inequation (15) is not satisfied, the flare of the sagittal plane is increased.

Further, it is preferable that the radius $R_7$ of the concave mirror in the relaying mirror system satisfies:

$$|R_7| < |R_6|, \text{ and}$$

$$|R_7| < |R_8| \tag{16}$$

By satisfying this, the relaying system F serving as a field optical system can effectively converge the rays from the component mirror system $S_2$ and form an image on the object point of the third component mirror system $S_3$. If this is not satisfied (inequation(16)), the field effect is not sufficiently performed, with the result that it is difficult to reduce the size of the component mirror system $S_3$.

In this embodiment, it is preferable to effect the imaging adjustment by displacing at least one mirror system of the component mirror systems $S_1$, $S_2$, $S_3$ and $S_4$ and the relay mirror system F in terms of the aberration correction and the magnification adjustment.

In the third embodiment, in order to minimize the eclipse under the condition that overall good optical performance is maintained, it is preferable that the component mirror systems satisfy the requirements defined by the inequations (1), (2) and (3). When the effective object field is in the form of an arcuation $Q_1$ as shown in FIG. 4, the reflection mirrors are not necessarily in the form of a circle, but the part of the circle not attributable to the imaging may be cut away.

The following is an example of data of the apparatus in accordance with the third embodiment shown in FIG. 10.

| $R_1 = -640$ | $D_1 = -283.5$ |
|---|---|
| $R_2 = -141$ | $D_2 = 247.5$ |
| $R_3 = -379$ | $D_3 = -1000$ |
| $R_4 = 558$ | $D_4 = 354$ |

-continued

| | |
|---|---|
| $R_5 = 434$ | $D_5 = -290$ |
| $R_6 = 432.5$ | $D_6 = 590$ |
| $R_7 = -330$ | $D_7 = -850$ |
| $R_8 = 494.47$ | $D_8 = 280$ |
| $R_9 = 230.78$ | $D_8 = -385$ |
| $R_{10} = 546.31$ | $D_{10} = 1115$ |
| $R_{11} = -805.14$ | $D_{11} = -615$ |
| $R_{12} = -271.58$ | $D_{12} = 530$ |
| $R_{13} = -787.307$ | |

The effective objective field is 3 mm in the slit width, and the effective F number is 3.0. (NA=0.165). The width of effective field of the object point $P_1$ extends from the image height 197–200.

Figure 11:
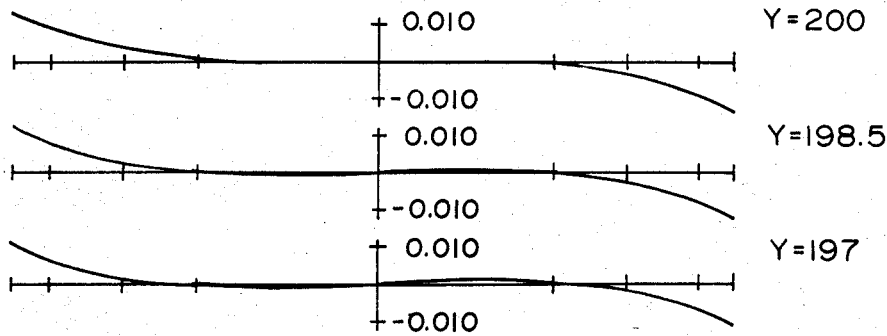
FIG. 11 shows the aberration of the optical system according to the third embodiment.
Figure 11:
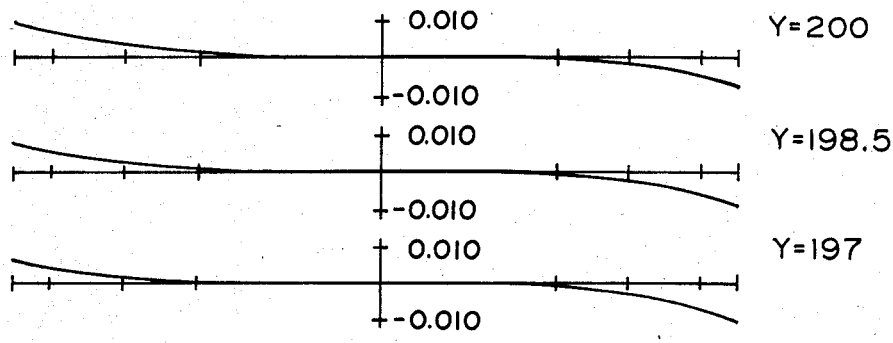

FIG. 11 shows the aberrations in the optical system according to the third embodiment.

Figure 12:
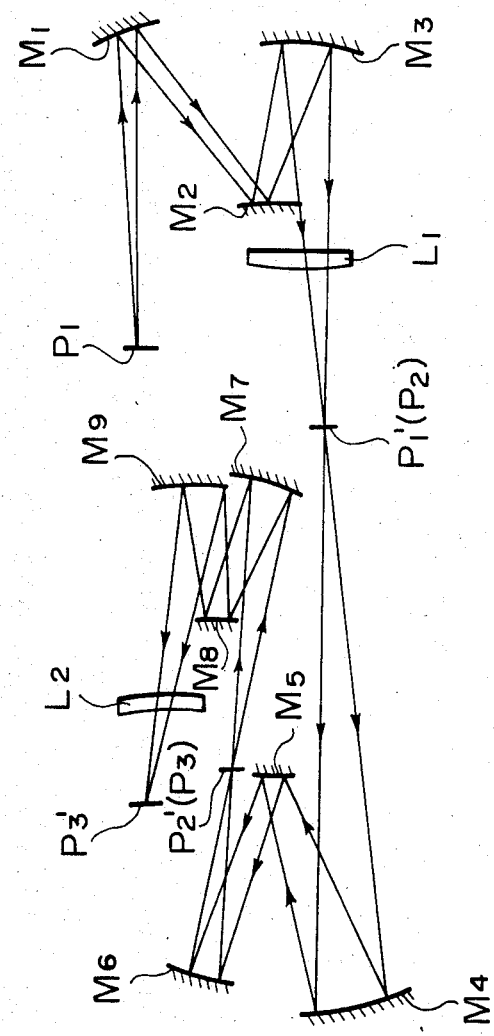
FIG. 12 shows an optical arrangement of the apparatus according to the fourth embodiment of the present invention.
Figure 13:
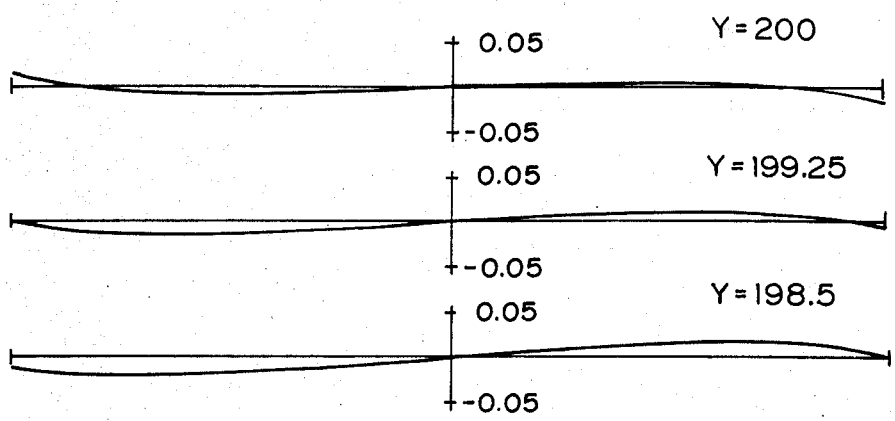
FIG. 13 shows the aberration of the optical system according to the fourth embodiment.
Figure 13:
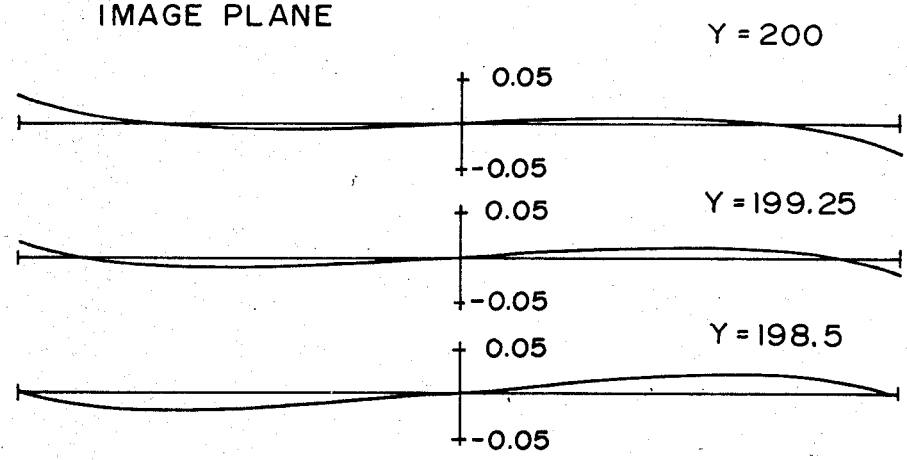

FIG. 12 shows an optical arrangement of a reflection optical system of an apparatus according to a fourth embodiment of the present invention. This reflection optical system, as shown in FIG. 12, comprises a first concave mirror and a convex mirror having the respective centers of curvature at the same side and on one and the same axis and comprises a second concave mirror having a different radius of curvature from the first concave mirror, those optical elements constituting a component mirror system. Three of such component mirror systems are arranged so that the overall imaging magnification is less than unity, that is, reduction. In this optical system, reflection mirrors $M_1$, $M_2$ and $M_3$ constitute a first component mirror system $S_1$; reflection mirrors $M_4$, $M_5$ and $M_6$ constitute a second component mirror system $S_2$; and reflection mirrors $M_7$, $M_8$ and $M_9$ constitute a third component mirror system $S_3$. The light rays from the object point $P_1$ within the predetermined range off the optical axis are reflected by the reflection mirrors $M_1$, $M_2$ and $M_3$ in this order and then passed through a group of lenses $L_1$ and imaged on a first imaging point $P_1'$. The imaging point $P_1'$ is the object point $P_2$ of the second component mirror system $S_2$. The rays from the object point $P_2$ are reflected by the reflection mirrors $M_4$, $M_5$ and $M_6$ in the order named and then imaged on the second imaging point $P_2'$. Similarly, the second imaging point $P_2'$ is the object point $P_3$ of the third component mirror system $S_3$. The rays from the object point $P_3$ are reflected by the reflection mirrors $M_7$, $M_8$ and $M_9$ in this order and passed through a group of lens $L_2$ and then imaged on the third imaging point $P_3'$.

In ths embodiment, the optical axis of the first component mirror system and that of the second component mirror system are coincident with each other, while the optical axis of the third component mirror is offset so that it extends parallel to the other axis. By arranging the plural component mirror systems in this manner, a reflection optical system having a reduced magnification as a whole is provided, wherein the possible physical interference between the component mirror systems is prevented, and the eclipse is reduced so that the light rays are transmitted to the final image plane $P_3'$.

Assuming that the optical axis of the third component mirror is not offset from the common optical system of the first and second component mirror systems, the rays reflected by the reflection mirror $M_7$ of the third component mirror system are shaded by the reflection mirror $M_5$ of the second component mirror system.

In the fourth embodiment, the magnifications of the first component mirror system (including the group of the lenses $L_1$), the second component mirror system and the third component mirror system (including the group of lenses $L_2$) are 0.41, 0.78 and 1.07, respectively. By the use of the reduction power system and the enlarging power system, the aberration is corrected in good order as a whole.

In this embodiment, the group of lenses $L_2$ is as a part of the third component mirror system $S_3$ which is of an enlarged magnification power and is effective to correct the off-axis spherical aberration. And, the group of lenses $L_1$ as a part of the first component mirror system $S_1$ which is of a reduced magnification power is effective to remove the chromatic aberration resulting from the use of the group of lenses $L_2$. Due to the combined effects of the lens groups $L_1$ and $L_2$, the spherical aberration and the chromatic aberration are corrected with a good balance.

Thus, the refractive optical systems are used as parts of the component mirror systems, so that the power burdened on the component mirror systems is reduced and that the amount of aberration stemming from the component mirror systems is reduced. The chromatic aberration produced by the introduction of the refractive optical system is corrected by the additional refractive optical system associated with another component mirror system so as to accomplish a satisfactory aberration correction with good balance as a whole. Particularly, it is preferable that the refractive optical system is provided in association with the component mirror system of an enlarging power and the component mirror system of a reducing power, respectively, in terms of the aberration correction.

The groups of the lenses $L_1$ and $L_2$ may have a negative or positive refractive power. In this embodiment, a meniscus lens having a positive refractive power is used as the second lens group $L_2$ with the concave side thereof is faced to the image plane. This meniscus lens arrangement is preferable because the spherical aberration is satisfactorily corrected with a smaller number of lenses.

Thus, in this embodiment, by disposing a positive or negative refractive power lens group $L_2$ in association with the third component mirror system, the positive or negative power required for the elements of the component mirror can be saved, and therefore, the power needed in each of the reflection mirrors can be generally reduced, whereby the various aberrations other than the spherical aberration can also be simultaneously reduced.

In this embodiment, each of the first and second lens groups is constituted by a single lens of $SiO_2$ (quartz) which can transmit the light of small wave length.

The following is an example of data of an apparatus according to the fourth embodiment.

| | | |
|---|---|---|
| $R_1 = -630.56$ | $D_1 = -279$ | $N = -1$ |
| $R_2 = -119.25$ | $D_2 = 230$ | $N = 1$ |
| $R_3 = -400.708$ | $D_3 = -300$ | $N = -1$ |
| $R_4 = \infty$ | $D_4 = -20$ | $N = -SiO_2$ |
| $R_5 = 6373.08$ | $D_5 = -1070$ | $N = -1$ |
| $R_6 = 597.39$ | $D_6 = 335$ | $N = 1$ |
| $R_7 = 223.25$ | $D_7 = -292$ | $N = -1$ |
| $R_8 = 416.74$ | $D_8 = 735.395$ | $N = 1$ |
| $R_9 = -440.28$ | $D_9 = -200$ | $N = -1$ |
| $R_{10} = -250.86$ | $D_{10} = 190$ | $N = 1$ |
| $R_{11} = -458.68$ | $D_{11} = -300$ | $N = -1$ |
| $R_{12} = -711.43$ | $D_{12} = -20$ | $N = -SiO_2$ |
| $R_{13} = -799.89$ | | $N = -1$ |
| Refractive Index of $SiO_2$: | | |
| 1.474730 (wavelength = 365 nm) | | |

1.509720 (wavelength = 290 nm)

In this example of the embodiment, the optical axis of the third component mirror system and that of the second component mirror system are parallel and offset by 120 (mm). The effective F number is 3.5, and the effective width of the object point on the optical axis is 1.5 mm. The imaging magnification is ⅓.

It is also preferable that the above inequations (1), (2) and (3) are satisfied in the component mirror system in the fourth embodiment.

While the invention has been described with reference to the structures disclosed herein, it is not confined to the details set forth and this application is intended to cover such modifications or changes as may come within the purposes of the improvements or the scope of the following claims. For example, the use of three mirrors in the component mirror system to preferable as in the embodiments described above. However, this is not limiting, and the component mirror system may be formed by two mirrors, the concave and convex mirrors; and the component mirror system may be formed by four mirrors, concave, convex, concave and convex mirrors.

What is claimed is:

1. An off axis imaging reflection optical system, comprising:
    a first component mirror system including a plurality of mirror elements and being effective to form an image at an enlarged magnification;
    a second component mirror system including a plurality of mirror elements and being effective to form an image at a reduced magnification;
    wherein said first and second component mirror systems are arranged to form an image of an object at a reduced overall magnification, and wherein at least one of said mirror elements has its working surface off a common optical axis of other mirror elements.

2. A reflection optical system comprising:
    a first component mirror system effective to form an image at an enlarged magnification; and
    a second component mirror system effective to form an image at a reduced magnification;
    said first and second component mirror systems are arranged to form an image of an object at a reduced overall magnification, wherein one of said first and second component mirror systems is adapted to substantially remove aberration caused by the other and wherein each said component mirror system includes a first concave mirror, a convex mirror and a second concave mirror which has a radius of curvature which is different from that of the first concave mirror.

3. A reflection optical system, comprising:
    a first component mirror system effective to form an image at an enlarged magnification;
    a second component mirror system effective to form an image at a reduced magnification;
    a relaying optical system for preventing loss of light transmission; and
    said first and second component mirror systems and said relaying optical system configured to form an image of an object at a reduced overall magnification, wherein one of said first and second component mirror systems is adapted to substantially remove aberration caused by the other and wherein each said component mirror system includes a first concave mirror, a convex mirror and a second concave mirror having a radius of curvature different from that of the first concave mirror.

4. An optical system according to claim 3, wherein said relaying optical system includes at least one concave mirror.

5. An optical system according to claim 3, wherein said relaying optical system includes a flat mirror.

6. An optical system according to claim 3, wherein said relaying optical system includes a concave mirror and a flat mirror.

7. A reflection optical system comprising:
    a first component mirror system effective to form an image at an enlarged magnification;
    a second component mirror system effective to form an image at a reduced magnification; and
    said first and said second component mirror system arranged to form an image of an object at a reduced overall magnification, wherein optical axes of adjacent component mirror systems are parallel and offset and wherein one of said first and said second componet mirror systems is adapted to substantially remove aberration caused by the other.

* * * * *

UNITED STATES PATENT AND TRADEMARK OFFICE
CERTIFICATE OF CORRECTION

PATENT NO. : 4,701,035
DATED : October 20, 1987
INVENTOR(S) : RYUSHO HIROSE

It is certified that error appears in the above-identified patent and that said Letters Patent is hereby corrected as shown below:

COLUMN 1

Line 58, "grreatly" should read --greatly--.

COLUMN 2

Line 31, "an" should read --a--.

COLUMN 3

Line 25, "mirror" should read --mirrors--.

COLUMN 4

Line 51, "reduced a" should read --a reduced--.
Line 67, "provides" should read --provide--.

COLUMN 5

Line 4, "$S_1$, $S_2$ and $S_4$" should read --$S_1$, $S_2$ and $S_3$--.

COLUMN 6

Line 50, "majored" should read --measured--.

COLUMN 7

Line 56, "system $S_1$ and $S_3$" should read --systems $S_1$ and $S_3$--.

UNITED STATES PATENT AND TRADEMARK OFFICE
CERTIFICATE OF CORRECTION

PATENT NO. : 4,701,035
DATED : October 20, 1987
INVENTOR(S) : RYUSHO HIROSE

It is certified that error appears in the above-identified patent and that said Letters Patent is hereby corrected as shown below:

COLUMN 8

Line 19, "mirror $S_2$" should read --mirror system $S_2$--.

COLUMN 9

Line 11, "systems F" should read --system F--.
Line 53, "systems F" should read --system F--.
Line 63, "system," should read --systems,--.

COLUMN 10

Line 50, "relay" should read --relaying--.

COLUMN 11

Line 6, "$D_8 = -385$" should read --$D_9 = -385$--.
Line 14, "197-200." should read --197-200 mm.--.
Line 52, "mirror is" should read --mirror system is--.
Line 61, "mirror is" should read --mirror system is--.

COLUMN 13

Line 21, "to" should read --is--.
Line 29, "off axis" should read --off-axis--.

UNITED STATES PATENT AND TRADEMARK OFFICE
CERTIFICATE OF CORRECTION

PATENT NO. : 4,701,035

DATED : October 20, 1987

INVENTOR(S) : RYUSHO HIROSE

It is certified that error appears in the above-identified patent and that said Letters Patent is hereby corrected as shown below:

COLUMN 14

Line 41, "system" should read --systems--.
Line 46, "componet" should read --component--.

Signed and Sealed this

Thirty-first Day of January, 1989

Attest:

DONALD J. QUIGG

*Attesting Officer*         *Commissioner of Patents and Trademarks*